(12) United States Patent
Dubouloz et al.

(10) Patent No.: US 8,249,208 B2
(45) Date of Patent: Aug. 21, 2012

(54) METHOD AND DEVICE FOR DOWNCONVERTING THE SAMPLING FREQUENCY OF A DIGITAL SIGNAL, FOR EXAMPLE IN A NON-INTEGER FREQUENCY RATIO

(75) Inventors: Samuel Dubouloz, Annemasse (FR); Antoine Hue, Saint Genis Pouilly (FR)

(73) Assignee: ST-Ericsson SA, Geneva (CH)

( * ) Notice: Subject to any disclaimer, the term of this patent is extended or adjusted under 35 U.S.C. 154(b) by 778 days.

(21) Appl. No.: 12/372,258

(22) Filed: Feb. 17, 2009

(65) Prior Publication Data

US 2009/0207959 A1 Aug. 20, 2009

(30) Foreign Application Priority Data

Feb. 18, 2008 (EP) .................................... 08151565

(51) Int. Cl.
*H04L 7/00* (2006.01)
(52) U.S. Cl. ........ 375/355; 375/316; 375/350; 708/313; 708/490; 708/315; 708/420
(58) Field of Classification Search .................. 375/350, 375/355, 316; 708/313, 490
See application file for complete search history.

(56) References Cited

U.S. PATENT DOCUMENTS

| | | | | |
|---|---|---|---|---|
| 5,892,694 A * | 4/1999 | Ott | ................................. | 708/313 |
| 6,259,389 B1 * | 7/2001 | McGrath | ....................... | 341/120 |
| 7,072,429 B1 * | 7/2006 | Sogo | ............................. | 375/350 |
| 2005/0276351 A1 * | 12/2005 | Puma et al. | .................... | 375/316 |
| 2006/0248133 A1 | 11/2006 | Li | ................................. | 708/200 |
| 2006/0277238 A1 * | 12/2006 | Heeb | ............................ | 708/490 |

FOREIGN PATENT DOCUMENTS

| | | |
|---|---|---|
| DE | 10015700 | 10/2001 |
| EP | 0881764 | 12/1998 |

OTHER PUBLICATIONS

Babic et al., "Decimation by irrational factor using CIC filter and linear interpolation", Telecommunication Lab., Tampere University of Technology, Tampere Finland, IEEE, 2001, pp. 3677-3680.
Babic et al., "Implementation of the transposed farrow structure", Institute of Communication Engineering, IEEE, 2002, pp. IV5-IV8.

(Continued)

*Primary Examiner* — Eva Puente
(74) *Attorney, Agent, or Firm* — Allen, Dyer, Doppelt, Milbrath & Gilchrist, P.A.

(57) ABSTRACT

A method for converting a sampling frequency of a digital signal sampled at a first sampling frequency includes receiving digital signal input samples, and forming output samples corresponding to a second sampling frequency based on the digital signal input samples and an interpolation filter. The first sampling frequency may be larger than the second sampling frequency. The method may further include delivering the output samples. Forming output samples includes, for each of the digital signal input samples, updating current values of N successive output samples with N contributions. The N contributions may be respectively calculated based on a value of a current input sample of the digital input samples weighted by values of N filter coefficients associated with the current input sample, N being fixed and identical for all the digital signal input samples regardless of a value of the conversion ratio between the first and second sampling frequencies.

43 Claims, 8 Drawing Sheets

OTHER PUBLICATIONS

Farrow, "A continuously variable digital delay element", AT&T, Middletown, NY, IEEE, 1998, pp. 2641-2645.

Gardner, "Interpolation in digital modems—part I: fundamentals", IEEE Transactions on Communications, vol. 41, No. 3, Mar. 1993, pp. 501-507.

Erup et al., "Interpolation in digital modems—part II: implementation and performance", IEEE Transactions on Communications, vol. 41, No. 6, Jun. 1993, pp. 998-1008.

Ramstad, "Digital methods for conversion between arbitrary sampling frequencies", IEEE Transactions on Acoustics, vol. ASSP-32, No. 3, Jun. 1, 1984, pp. 577-591.

* cited by examiner

METHOD AND DEVICE FOR DOWNCONVERTING THE SAMPLING FREQUENCY OF A DIGITAL SIGNAL, FOR EXAMPLE IN A NON-INTEGER FREQUENCY RATIO

FIELD OF THE INVENTION

The invention relates in particular to the down conversion of the sampling frequency of a digital signal, also called "sub-sampling" or "decimation", in a, for example, non-integer, frequency conversion ratio between the input sampling frequency (which is the higher) and the output sampling frequency (which is lower).

The invention applies advantageously but non-limitingly to wireless communication systems and, more particularly, to multi-standard reception platforms which use multiple different sampling frequencies.

BACKGROUND OF THE INVENTION

The WiMAX standards (acronym for "Worldwide Interoperability for Microwave Access"), which is a family of standards defining high-speed RF connections intended mainly for point-multipoint architectures, may be cited in this regard. The WiMAX standards comprise in particular the standards of the 802.16 family.

The standards of the 802.11 family, also known by the name "WiFi standards", may also be cited. The IEEE 802.11 standard is an international standard describing the characteristics of a wireless local area network (WLAN) capable of communicating at high speed over a radius of several tens of meters indoors.

The production of a receiver capable of being compatible with several transmission standards generally requires the ability to process multiple sampling frequencies of the digital signal. Because of the frequency synthesis constraints, the sampling frequency of the signal at the level of the analog/digital conversion stage is not necessarily flexible.

Moreover, analog/digital converters of low power, that is to say of low current consumption, make increasing use of oversampling to reduce the number of quantization levels while maintaining a good signal/quantization noise ratio. This type of analog/digital converter therefore generally requires that the quantization noise be filtered outside of the useful band of the signal and that the sampling frequency be reduced to a lower value than that at which the digital signal is processed. Therefore, conventional sampling frequency conversion devices generally require a certain number of multiplications at high frequency, which leads to considerable complexity of the device and consequently to significant power consumption.

Moreover, it is desirable to be able to perform a sampling frequency conversion in a non-integer conversion ratio, so as to be capable of providing a sampling frequency that is compatible both with the desired transmission standard and with the sampling frequency of the analog/digital conversion stage.

Several approaches exist for performing a sampling frequency conversion with a non-integer conversion ratio.

A first approach includes converting the digital signal into an analog signal, using a digital/analog converter, then filtering the analog signal, and thereafter reconverting it into a digital signal with the desired sampling frequency. Such an approach is hardly satisfactory since it leads to significant conversion noise and there is hardly a satisfactory method for generating the clock signal of the analog/digital converter allowing the reconversion of the analog signal to the desired sampling frequency.

Another approach includes oversampling the digital signal by a factor S, in filtering at the same time the signal aliasing components and the quantization noise, and in thereafter performing a decimation (sampling frequency down conversion), by a factor M. A sampling frequency conversion in a rational ratio S/M is then obtained. However, such an approach is not truly flexible. Indeed, only a small number of conversion ratios can be foreseen, since each conversion ratio may require the production of a filter. Furthermore, generally only rational frequency conversion ratios (ratios whose numerator and denominator are integers) can be used. Furthermore, with operating frequencies currently already being very high, it is particularly difficult to carry out an oversampling without increasing the power consumption and the overall complexity of the device.

Another approach resides in an interpolation, or in a calculation of new samples (interpolated samples) on the basis of the input samples by using an interpolation filter. However, such approaches are currently complicated and use significant memory resources, as well as high-speed buses, for storing all the coefficients of the filter as a function of the temporal deviation between an interpolated sample and the input samples, which serve to calculate this interpolated sample.

Moreover, in certain applications, stages of the delta-sigma type are advantageously used for the analog/digital conversion stages for generating the digital signal whose sampling frequency is to be converted. Such analog/digital converters of delta-sigma type are particularly beneficial since they make it possible to code the digital signal on a low number of bits while rejecting the quantization noise outside of the useful band of the signal. The current approaches for sampling frequency down conversion (decimation) are not suited to oversampled signals originating from converters of the delta-sigma type since the current approaches generally perform only a filtering of the signal aliasing components, but not of the quantization noise.

SUMMARY OF THE INVENTION

According to one mode of implementation and embodiment, a method and a device for converting a sampling frequency of a digital signal is proposed. The device and method make it possible to perform a frequency down conversion in a rational or irrational, integer or non-integer ratio, which is adjustable, thereby making it possible to readily adapt to transmission multi-standard reception platforms.

There is also proposed, according to one mode of implementation and embodiment, a method and device for converting a sampling frequency using an interpolation filter with a low complexity of production and implementation.

There is also proposed, according to another mode of implementation and embodiment, a method and device for converting a sampling frequency which allows filtering of the replicas of the signal and also of any component of the signal which might be aliased in the useful band of the signal after the sampling frequency conversion. Thus, it is possible to filter the quantization noise arising, for example, from an analog/digital conversion stage.

There is also proposed, according to another mode of implementation and embodiment, a method and device for converting a sampling frequency in which no approximation on the form of the filter is performed. Thus it is possible to take exact filtering coefficients into account.

According to one aspect, a method for converting a sampling frequency of a digital signal sampled at a first sampling frequency includes: reception of input samples of the digital signal, and formulation of output samples corresponding to a second sampling frequency on the basis of the input samples and of an interpolation filter. The first sampling frequency is larger than the second sampling frequency. The method also includes delivery of the output samples.

According to this aspect, the formulation of the output samples includes for each current input sample, the updating of the current values of N successive output samples with N contributions, respectively calculated on the basis of the value of this current input sample, and weighted by the values of N filter coefficients associated with this current input sample. This number N is fixed and identical for the input samples, no matter the value of the conversion ratio between the two frequencies, which can be arbitrary, for example, integer or non-integer.

Stated otherwise, according to this approach, and unlike the existing approach in which the impulse response of the filter is based on a first time period corresponding to the first sampling frequency (thereby implying that an output sample should be calculated with a fixed number of input samples), the interpolation filter is based on the second time period corresponding to the second sampling frequency, thereby signifying that an input sample contributes to the determination of the values of a fixed number of output samples. This fixed number is also independent of the conversion ratio. This is not the case for the existing approaches, which consequently involve storage of filter coefficients for each conversion ratio.

On the other hand, if each current input sample contributes to the determination of the values of a fixed number of output samples, an output sample can receive a different number of contributions from the number of contributions intended for another output sample.

Thus, it is possible to filter not only the replicas of the sampled signal, but also any component which might be aliased in the useful band after conversion of the sampling frequency.

Even if the value of the conversion ratio can be arbitrary, there is a particularly beneficial mode of implementation for non-integer, rational or irrational values of the conversion ratio, since this affords in particular an approach and a hardware embodiment, even for non-integer conversion ratios.

Moreover, the coefficients of the filter can be, for example, advantageously calculated "on line." In other words, the coefficients can be calculated when they are needed for the calculation of the contributions.

According to one mode of implementation, an output sample is delivered, whose value has been updated with a contribution originating from a current input sample, if this output sample should not receive any contribution originating from the following input sample. The effective value of this delivered output sample is then the value updated with the contribution originating from the current input sample.

According to one mode of implementation, the width of the impulse response of the interpolation filter fixes the value of the number N. Thus, for example, an interpolation filter is chosen, the width of whose impulse response is equal to the product of a multiplying coefficient times the second time period corresponding to the second sampling frequency, and the value of N is fixed at a value equal to the higher integer part of the multiplying coefficient.

According to an exemplary implementation, during the updating of the values of the output samples of ranks n to n+N−1, these N output samples are respectively assigned N storage of ranks $r_1$ to $r_N$ in each of which is accumulated, for the output sample considered, the various contributions arising from the various input samples. The delivery of the output sample of rank n with its effective value includes the delivery of the value included in the storage of rank $r_1$. The assignment of the registers of ranks $r_1$ to $r_{N-1}$ is to the output samples of ranks n+1 to n+N−1, the assignment of the register of rank $r_N$ is to the output sample of rank n+N, and the initialization of the register of rank $r_N$ to a chosen initialization value, for example the zero value. An exemplary implementation, such as this, is particularly simple to carry out.

According to one mode of implementation, the input samples are received in time with the edges of a clock signal having a frequency equal to the first sampling frequency, and the output samples are formulated in time with the edges of this clock signal. On the other hand, the output samples are delivered on only some of the edges of the clock signal. This depends in particular on the number of contributions for formulating the effective value of an output sample. Thus, the output samples delivery frequency can be different from the second sampling frequency. These delivered output samples actually correspond to a sampling of the digital signal at the second sampling frequency.

The value of the sampling frequency conversion ratio is advantageously selected from among a suite of values corresponding to values of second sampling frequency that are compatible with several different standards, for example the WiMAX or WiFi standards.

An interpolation filter is also advantageously chosen whose amplitude/frequency response curve exhibits zeros at the frequencies which are multiples of the second sampling frequency.

This makes it possible to have good attenuation in frequency bands situated around the multiples of the second sampling frequency. This is particularly beneficial when the analog/digital conversion of the signal is of the delta-sigma type. Indeed, such a filter makes it possible to filter the quantization noise effectively.

It is, for example, possible to use an interpolation filter whose amplitude/frequency response curve exhibits a form of the type sin c2·cos (sin c2 denotes the cardinal sine function squared). This makes it possible to obtain an attenuation of at least 60 dB in the bands mentioned above.

According to one mode of implementation, the calculation of the N contributions of a current input sample includes the determination of the temporal position of this current input sample with respect to the N temporal instants, termed "temporal instants of interpolation", spaced mutually apart by the second time period corresponding to the second sampling frequency and respectively associated with the N updated output samples, and the consideration of the temporal position in the determination of the values of the N coefficients of the filter.

More precisely and by way of example, if the input samples arrive at first temporal instants, the determination of the temporal position of a current input sample with respect to the N temporal instants of interpolation comprises the determination of a temporal interval between the first temporal instant associated with this current input sample and one of the N temporal instants of interpolation, and the determination of the other temporal intervals between the first instants and the N−1 other temporal instants of interpolation on the basis of the temporal interval, and the values of the N coefficients of the filter correspond respectively to the values of the impulse response of the filter at these N temporal intervals.

Moreover, the fact of basing the impulse response of the interpolation filter on the value of the second time period, and the fact of using this second time period as a temporal reference base for the interpolation, enables the determination of the values of the coefficients of the filter on the basis of a function of the temporal interval.

This function can comprise, for example, at least one linear zone, this being the case when the filter has an amplitude/frequency response curve exhibiting a form of the type sin c2·cos. This then allows a significant reduction in production complexity.

Actually, according to one mode of implementation, the value of the temporal interval varies between 0 and 1 and an auxiliary temporal interval is defined on the basis of this temporal interval, whose value is equal to that of the temporal interval referred to the span [0; 0.25], and the calculation of a contribution of a current input sample comprises a single multiplication of the value of this input sample with the value of the auxiliary temporal interval.

According to another aspect, there is also proposed a method for processing an analog signal, comprising an analog/digital conversion of the analog signal and a method for converting sampling frequency as defined previously, of a digital signal arising from the analog/digital conversion. The analog/digital conversion can be of the delta-sigma type.

Moreover, the analog signal can be a signal chosen from among several signals respectively compatible with several transmission standards, for example the WiMAX or WiFi standard.

According to another aspect, there is also proposed a device for converting the sampling frequency of a digital signal sampled at a first sampling frequency.

This device comprises a receiver able to receive input samples of the digital signal, a formulator able to formulate the output samples corresponding to a second sampling frequency on the basis of the input samples and of an interpolation filter, the first sampling frequency being larger than the second sampling frequency, and an output able to deliver output samples. The formulator comprising a calculator able for each current input sample to calculate N contributions respectively on the basis of the value of this current input sample weighted by the values of N filter coefficients associated with this input sample, this number N being fixed and identical for all the input samples whatever the value of the conversion ratio between the two frequencies, and processor able for each input sample to update the current values of N successive output samples with the N contributions.

According to one embodiment, the formulator further comprises a controller to authorize the delivery of an output sample whose value has been updated with a contribution originating from a current input sample if this output sample should not receive any contribution originating from the following input sample, the effective value of this delivered output sample being the value updated with the contribution originating from the current input sample.

According to one embodiment, the processor comprises N inputs able to receive respectively the N contributions of a current input sample, N adders each possessing a first input coupled to the corresponding input of the processor and a second input, N multiplexers able to be controlled by the controller and each possessing a first input connected to the output of the corresponding adder and a second input, a chain of N registers each possessing an input coupled to the output of the corresponding multiplexer and an output coupled to the second input of the corresponding adder, the output of the last register of the chain being coupled to the output means and the output of each of the other registers being coupled to the second input of the multiplexer associated with the following register in the chain, an auxiliary register containing a zero value data item and coupled to the second input of the multiplexer associated with the first register of the chain.

According to one embodiment, the receiver is able to receive the input samples in time with the edges of a clock signal having a frequency equal to the first sampling frequency and the formulation means are able to formulate the output samples in time with the edges of the clock signal and the output means are able to deliver the output samples on only some of the edges of the clock signal.

According to one embodiment, the device can furthermore comprise a selector able to select the value of the ratio from among a suite of values corresponding to values of second sampling frequencies that are compatible with several different standards, for example the WiMax or WiFi standards.

According to one embodiment, the calculator comprises a first detector able to determine the temporal position of a current input sample with respect to the N second instants, termed temporal instants of interpolation, respectively associated with the N output samples intended to be updated, and a second detector able to determine the values of the N coefficients of the filter on the basis of the temporal position.

According to one embodiment, the first detector is able to determine a temporal interval between the first instant associated with a current input sample and one of the N temporal instants of interpolation, and to determine the other temporal intervals between the first instant and the N–1 other temporal instants of interpolation on the basis of the temporal interval, and the values of the N coefficients of the filter correspond respectively to the values of the impulse response of the filter at these N temporal intervals.

The second detector may be able to determine each of the N coefficients of the filter on the basis of a function of the temporal interval, this function possibly being, for example, a linear function.

In this case, the value of the temporal interval varying between 0 and 1, the first detector is able to determine an auxiliary temporal interval on the basis of this temporal interval whose value is equal to that of the temporal interval referred to the span [0; 0.25], and the calculator comprises a single multiplier possessing an input coupled to the input means and a second input coupled to the first detector for receiving the auxiliary temporal interval.

According to one embodiment, the calculator further comprises a block comprising at least one an adder, at least one subtractor and at least one shifter for shifting bits that are individually selectable as a function of the value of the temporal interval.

According to another aspect, there is also proposed a device for processing an analog signal comprising an input for receiving the analog signal, an analog/digital converter coupled to the input, and a sampling frequency conversion device such as defined above, whose input means are coupled to the output of the analog/digital converter. The analog/digital converter can be of the delta-sigma type.

According to another aspect, there is also proposed a receiver belonging to at least one wireless communication system, comprising an antenna for receiving an incident signal and a processing device such as defined above.

The receiver can thus form a multi-standard reception platform capable for example of processing signals compatible with the WiMAX or WiFi standard.

Other advantages and characteristics of the invention will become apparent on examining the detailed description of wholly non-limiting modes of implementation and embodiment and the appended drawings.

DETAILED DESCRIPTION OF THE PREFERRED EMBODIMENTS

Figure 1:
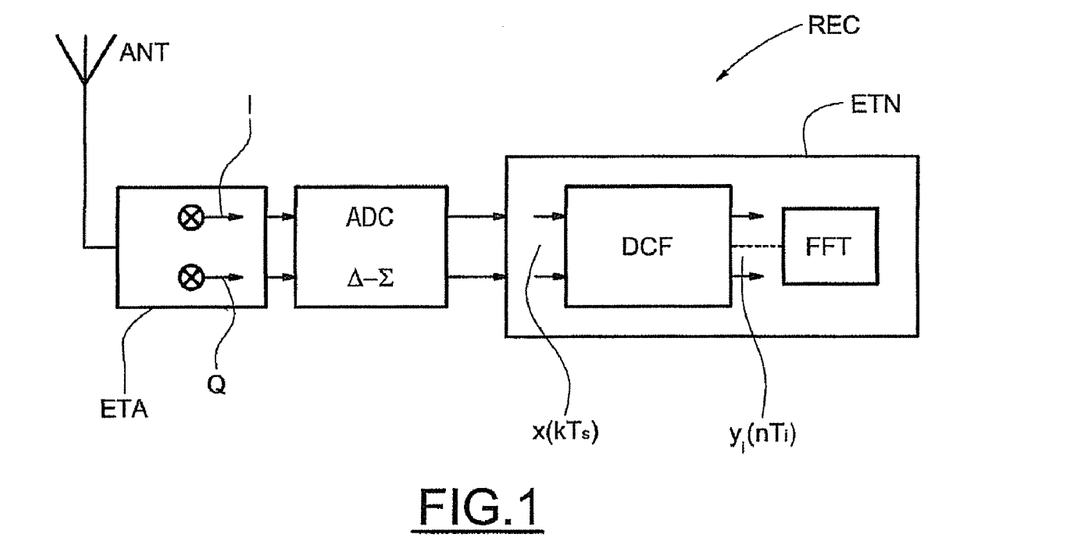
FIG. 1 schematically illustrates an embodiment of a multi-standard receiver incorporating an exemplary sampling frequency conversion device according to the invention.

In FIG. 1, the reference REC denotes a multi-standard receiver capable of processing signals compatible with various transmission standards, as for example the WiMAX and WiFi standards.

More precisely, this reception platform REC comprises an antenna ANT capable of receiving an incident signal compatible with one of the transmission standards. An analog processing stage ETA is connected to the antenna ANT and comprises, in particular, mixers capable of performing a frequency transposition so as to return, for example, the analog signal to baseband according to two quadrature processing pathways, namely the "I" (in phase) pathway and the "Q" (phase quadrature) pathway according to a conventional denomination known to the person skilled in the art.

To this analog processing stage ETA is coupled an analog/digital conversion stage ADC, preferably of the delta-sigma type. The structure of such an analog/digital conversion stage of the delta-sigma type is conventional and well known to the person skilled in the art.

A digital processing stage ETN is coupled to the output of the analog/digital conversion stage ADC and comprises in particular a sampling frequency conversion device DCF followed by other processing modules, for example an FFT module, embodied, for example, within a processor, commonly called a "baseband processor" by the person skilled in the art.

In wireless communication systems using, for example, a modulation of the OFDM type Orthogonal Frequency Division Multiplexing, which is a modulation of digital signals by orthogonal frequency division, the sampling frequency of the analog digital converter is not necessarily a multiple of the sampling frequency for the FFT block and specified by the standards.

By way of indication, for the WiFi-WiMAX standards, the sampling frequency of the signal fed to the FFT module can be chosen from among the following values for the WiFi standards: 10-20 MHz, for the standards WiMax: 4; 5.6; 8; 10; 11.2; 22.4 MHz.

It is therefore apparent in this application that the sampling frequency conversion device DCF should be capable of performing a frequency decimation, that is to say a sampling frequency down conversion, in a non-integer ratio, and not a rational ratio. This conversion ratio may therefore be a non-integer real number greater than 1, although integer numbers greater than 1 are also possible.

Furthermore, as seen in greater detail below, the device DCF is capable of selecting the conversion ratio $F_s/F_i$ from a set of predetermined values, for example, the set of values mentioned above. The frequency $F_s$ denotes the sampling frequency of the signal upstream of the device DCF, and is also subsequently called the "first sampling frequency", while $F_i$ denotes the sampling frequency of the digital signal delivered by the device DCF, also called the "second sampling frequency".

Subsequently in the text, by way of example, that the digital signal $x(kT_s)$ received by the device DCF, is a baseband signal, having a limited frequency band (varying from $-B/2$ to $+B/2$ where B denotes the bandwidth of the signal) greatly oversampled with a sampling frequency $F_s=1/T_s$. This sampling frequency $F_s$ is very much greater than $B/2$, for example of the order of ten to fifteen times $B/2$.

$y_i(nT_i)$ denotes the digital signal sampled at the frequency $F_i$ after conversion of the sampling frequency.

As seen in greater detail below, this sampling frequency conversion is performed on the basis, in particular, of an interpolation filter. In this regard, $h_I(t)$ denotes the impulse response of the interpolation filter in the time domain.

The frequency spectrum $X(f)$ of the input signal is periodic with a period $F_s$, thereby signifying that there are replicas of the signal at frequencies spaced apart by $F_s$. Moreover, the filtering operation is equivalent to a discrete sum.

The output digital signal, resampled at the frequency $F_i$, can be expressed by formula (I) below:

$$y_i(nT_i) = y(t) \cdot \sum_n \delta(t - nT_i) \qquad (I)$$

The equivalent of this formula (I) in the frequency domain is expressed by the formula (II) below:

$$Y_i(f) = [X(f) \times H_I(f)] * \sum_n \delta(f - nF_i) \qquad (II)$$

This equation shows the well known effect of aliasing. Each signal contained in a band of frequencies $[rF_i-B/2; rF_i+B/2]$ are added, because of the convolution, to the useful signal contained in the frequency band $[-B/2; +B/2]$.

Subsequently in the text, for the sake of simplification, $x_k$ denotes the samples of the input signal and $y_n$ denotes the output samples.

Figure 2:
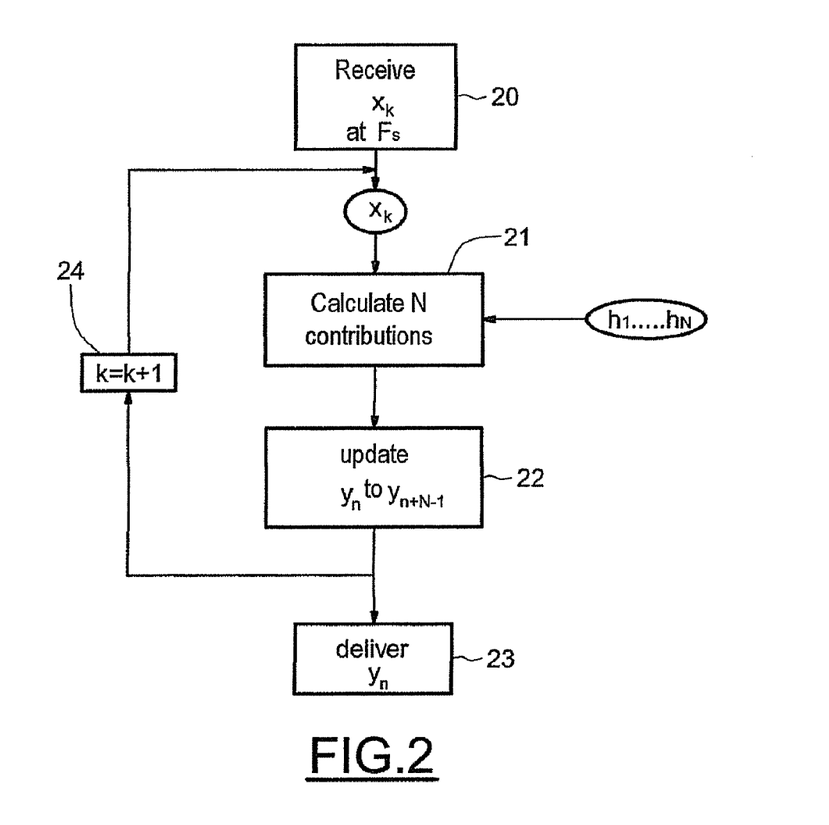
FIGS. 2 and 3 schematically illustrate exemplary implementations of a method for converting sampling frequency according to the invention.

Referring now more particularly to FIG. 2, it is seen than the input samples are received (step 20) at the first sampling frequency $F_s$.

The output samples $y_n$ corresponding to the second sampling frequency $F_i$ are formulated on the basis of the input samples and of an interpolation filter whose impulse response in the time domain is equal to $h_I$.

The ratio $F_s/F_i$ is strictly greater than 1 and is, for example, a rational or irrational non-integer number.

The formulation of the output samples includes for each current input sample $x_k$, the updating (step 22) of the current values of N successive output samples with N contributions respectively calculated (step 21) on the basis of the value of the current input sample $x_k$ weighted by the values of N filter coefficients h1, ... hN, which are associated with this current input sample. It should be noted that the number N is fixed and identical for all the input samples $x_k$, whatever the value of the ratio $F_s/F_i$.

Moreover, as seen in greater detail below, the delivery 23 is performed of an output sample $y_n$ whose value has been updated with a contribution originating from a current input sample $x_k$ if this output sample should not receive any contribution originating from the following input sample $x_{k+1}$. In this case, the effective value of this delivered output sample is the value updated with the contribution originating from the current input sample $x_k$.

In the converse case, that is to say if the sample $y_n$ should receive a contribution originating from the following input sample $x_{k+1}$, steps 21 and 22 are repeated for the sample $x_{k+1}$ (step 24).

Figure 3:
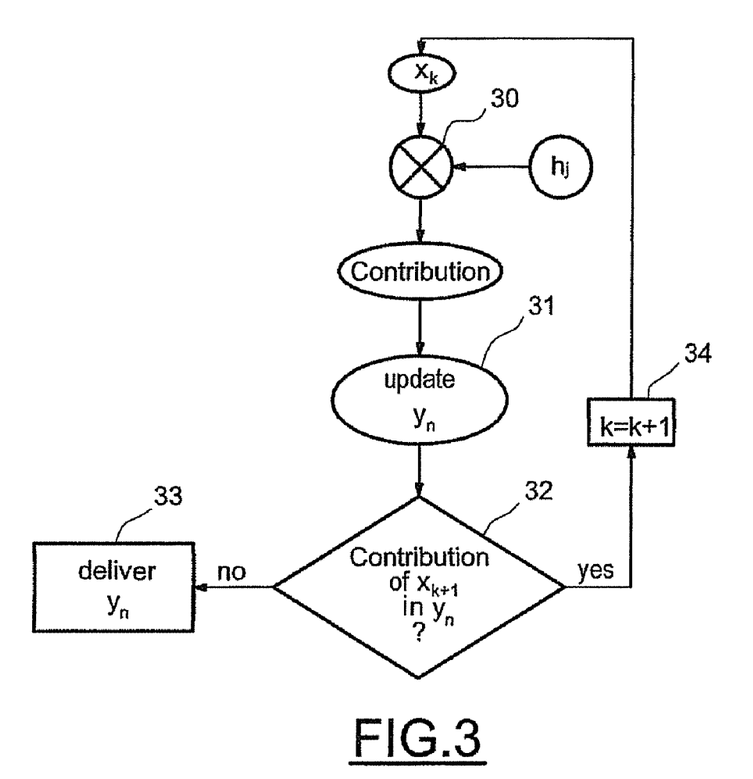

This is illustrated more precisely in FIG. 3. The contribution for the updating 31 of the sample $y_n$ is equal to the product 30 of the value of the current input sample $x_k$ times the value $h_j$ of the corresponding coefficient of the filter.

After updating the sample $y_n$ with this contribution, it is determined (step 32) whether or not the following input sample $x_{k+1}$ should make a contribution to the value of the output sample $y_n$.

If the response is no, then the output sample $y_n$ is delivered with its effective value equal to its last updated value. If the response is yes, the new contribution is calculated for the following input sample $x_{k+1}$ (step 34) in a manner analogous to that which has just been described for the current input sample $x_k$.

In a general manner, the width of the impulse response of the interpolation filter fixes the value of the number N. Thus, for example, if an interpolation filter is chosen, the width of whose impulse response is equal to the product $cm \cdot T_i$ (where cm denotes a multiplying coefficient, not necessarily integer, and $T_i$ the second time period corresponding to the second sampling frequency $F_i$), the value N is equal to the higher integer part of the multiplying coefficient cm (N=⌈cm⌉).

Figure 4:
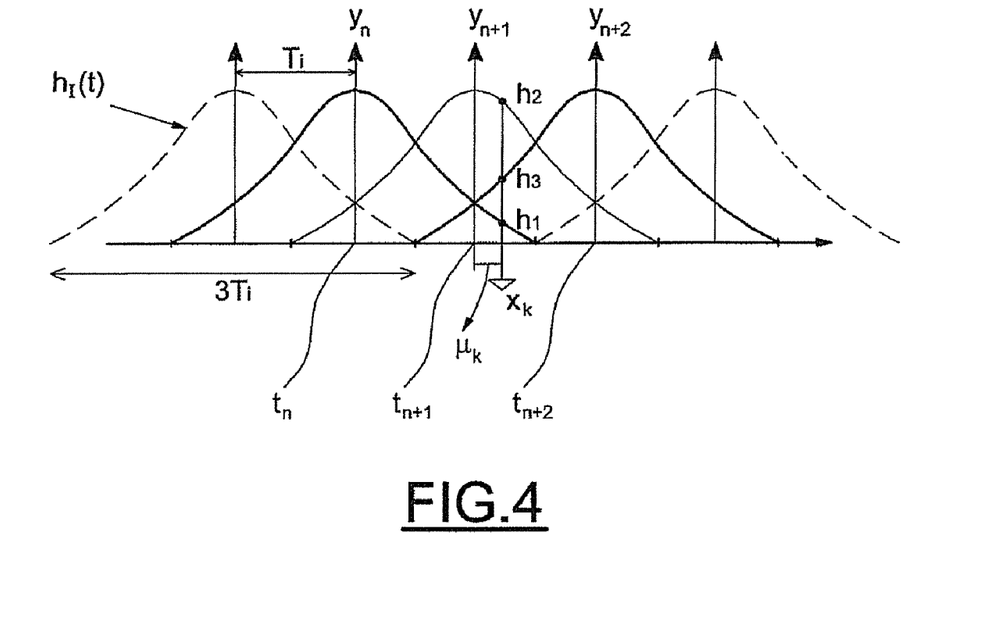
FIGS. 4 and 5 illustrate an exemplary implementation of the invention with an exemplary interpolation filter according to the invention.
Figure 5:
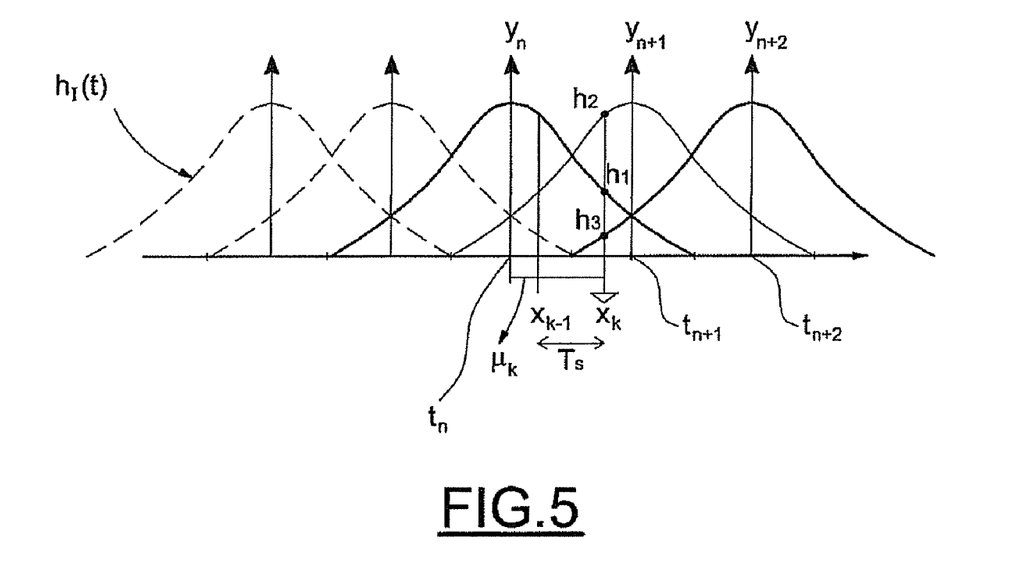

In the example illustrated in FIGS. 4 and 5, the interpolation filter has a bandwidth equal to 2.5 $T_i$. The number N is consequently equal to 3. In other words, each input sample contributes to the updating of three output samples.

It is also assumed in this example that the impulse response $h_f(t)$ is an even function $h_f(t)$ is equal to $h_f(-t)$, and $h_f(t)$ is equal to zero if t does not belong to the interval $[-3T_i/2; 3T_i/2]$.

The calculation of the N contributions (N=3 here) of each current input sample, comprises the determination of the temporal position of this input sample $x_k$ with respect to the N temporal instants, $t_n$, $t_{n+1}$, $t_{n+2}$ (FIGS. 4 and 5) that is dubbed "temporal instants of interpolations", which are spaced mutually apart by the second time period $T_i$ and are respectively associated with the N=3 updated output samples $y_n$, $y_{n+1}$, $y_{n+2}$. Also, this temporal position is taken into account in the determination of the values of the N coefficients of the filter (N=3 here).

Figure 6:
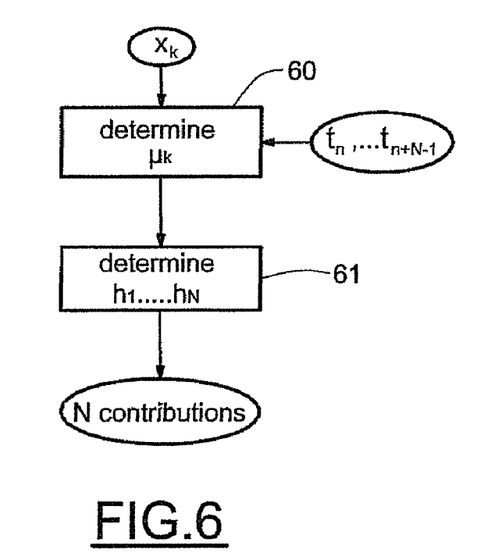
FIG. 6 schematically illustrates an exemplary determination of the contributions of an input sample according to the invention.

This is illustrated more precisely in FIG. 6, in the general case N. More precisely, according to this implementation, and if the temporal instants at which the input samples $x_k$ arrive are termed "first temporal instants", the determination of the temporal position of a current input sample $x_k$ with respect to the N temporal instants of interpolation $t_n, \ldots, t_{n+N-1}$, includes the determination of a temporal interval $\mu_k$ between the first temporal instant associated with the current input sample $x_k$ and one of the N temporal instants of interpolation, for example the previous temporal instant of interpolation.

In the case of FIG. 4, the previous temporal instant of interpolation is the instant $t_{n+1}$, while it is the instant $t_n$ in the configuration illustrated in FIG. 5.

As illustrated in FIG. 6, the values of the N filter coefficients h1, ... hN, with which the N contributions of the current input sample $x_k$ is calculated, is determined (step 61) on the basis of the determination 60 of $\mu_k$.

In the example illustrated in FIGS. 4 and 5, the calculation of the coefficients h1, h2 and h3 depends on the position of $\mu_k$ with respect to the value 0.5. More precisely, if the value of $\mu_k$ is less than 0.5, the configuration of FIG. 4 applies. In this case, it is seen that the three coefficients h1, h2 and h3 are respectively determined by the following formulae (III) (IV) and (V):

$$h1 = h_f(1+\mu_k) \quad \text{(III)}$$

$$h2 = h_f(\mu_k) \quad \text{(IV)}$$

$$h3 = h_f(1-\mu_k) \quad \text{(V)}$$

It is noted in this regard that $(1+\mu_k)$ and $(1-\mu_k)$ represent two other time intervals between the instant of arrival of the current sample $x_k$, and the other temporal instants of interpolation $t_n$ and $t_{n+2}$.

In the case where $\mu_k$ is greater than 0.5, the configuration illustrated in FIG. 5 applies. In this case, the coefficients h1, h2 and h3 are respectively given by formulae (VI), (VII) and (VIII) below:

$$h1 = h_f(\mu_k) \quad \text{(VI)}$$

$$h2 = h_f(1-\mu_k) \quad \text{(VII)}$$

$$h3 = h_f(2-\mu_k) \quad \text{(VIII)}$$

An exemplary algorithm for formulating the value of the output samples may be as follows for a current input sample $x_k$, step a): calculation of the value of $\mu_k$ through the formula:

$$\mu_k = [\mu_{k-1} + R](\text{mod } 1) \quad \text{(IX)}$$

(in this formula, R denotes the fractional decimation ratio $T_s/T_i$ which is less than 1 and mod denotes the modulo function).

Once the value of $\mu_k$ has been determined, it is possible to calculate the filter coefficients h1, h2, h3 associated with this current input sample $x_k$, in the following manner (step b):

a. if $\mu_k \leq 0.5$ i. $h1 = h_f(1+\mu_k) \quad h2 = h_f(\mu_k)$ $h3 = h_f(1-\mu_k)$ b. otherwise i. $h1 = h_f(\mu_k) \quad h2 = h_f(1-\mu_k)$ $h3 = h_f(2-\mu_k)$ It is then possible to update the values of the three output samples $y_n$, $y_{n+1}$ and $y_{n+2}$ in the following manner (step c):

$$y_n = y_n + h1 \cdot x_k$$

$$y_{n+1} = y_{n+1} + h2 \cdot x_k$$

$$y_{n+2} = y_{n+2} + h3 \cdot x_k$$

A check is carried out thereafter (step d) to verify whether the output sample $y_n$ is ready to be delivered with its effective value, that is to say whether or not it ought to receive a contribution originating from the following input sample $x_{k+1}$.

In this regard, a check is carried out to verify whether the following condition CD1 is satisfied, that is to say whether i. $(\mu_k \leq 0.5$ and $\mu_k+R \geq 0.5)$ or $\mu_k+R > 1.5$     (CD1)

If this condition CD1 is satisfied, it is then certain that $y_n$ does not receive any contribution from $x_{k+1}$. In this case, $y_n$ is ready to be delivered.

If such is the case, the output sample $y_n$ is actually delivered as output and, as seen in greater detail, a shift is performed of the registers to which the output samples are assigned and in which the various contributions arising from the various input samples are accumulated for the output sample considered.

In the converse case when the condition CD1 is not satisfied, for example, that is to say if the output sample is not ready to be delivered because it will receive a contribution from the following input sample $x_{k+1}$, steps a) to d), which have just been described, are repeated for the following sample $x_{k+1}$.

In particular, when the analog/digital converter ADC is a converter of the delta-sigma type, it is particularly beneficial to choose an interpolation filter whose amplitude/frequency response curve exhibits "0"s at frequencies that are multiples of the second sampling frequency $F_i$.

Moreover, for a particular example of the form of shaping the converter ADC of delta-sigma type, no attenuation of the signal is sought in the useful band of the signal and at least 60 dB of attenuation is sought in the bands $[rF_i \pm B/2]$.

An acceptable approach then includes using a cardinal sine function (sin c) for the amplitude/frequency response curve of the filter. Several approaches are possible according to the attenuation level desired. In this regard, it is possible to use either a simple sin c function, the product of a sin c function and a cosine function, or a sin c2 function (cardinal sine squared), the product of a sin c2 function and a cosine function, a sin c3 function (cardinal sine cubed), the product of this sin c3 function and a cosine function, or other functions that do or do not combine the cardinal sine function.

By way of indication, to obtain at least 60 dB of attenuation in the desired bands, it is possible to choose a form of the type sin c2·cos.

It is thus possible to choose the amplitude/frequency response curve $H_I(f)$ defined by the formula below.

$$H_I(f) = \mathrm{sin}_c\left(\frac{f}{F_i}\right)^2 \cdot \cos\left(2\pi\frac{f}{4F_i}\right) \quad (X)$$

which corresponds, after inverse Fourier transform, to an impulse response $h_i(t)$ equal to the formula below.

$$h_i(t) = \Pi_{T_i}(t) * \Pi_{T_i}(t) * \frac{1}{2}\left[\delta\left(t - \frac{T_i}{4}\right) + \delta\left(t + \frac{T_i}{4}\right)\right] \quad (XI)$$

Figure 7:
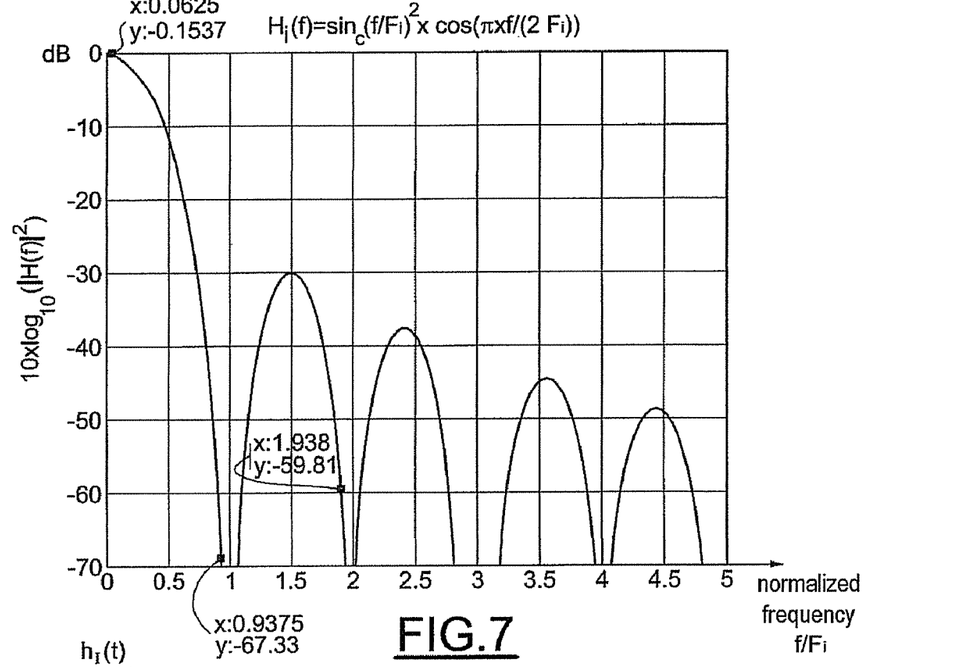
FIGS. 7 to 9 more precisely illustrate an example of characteristics of an interpolation filter according to the invention.
Figure 8:
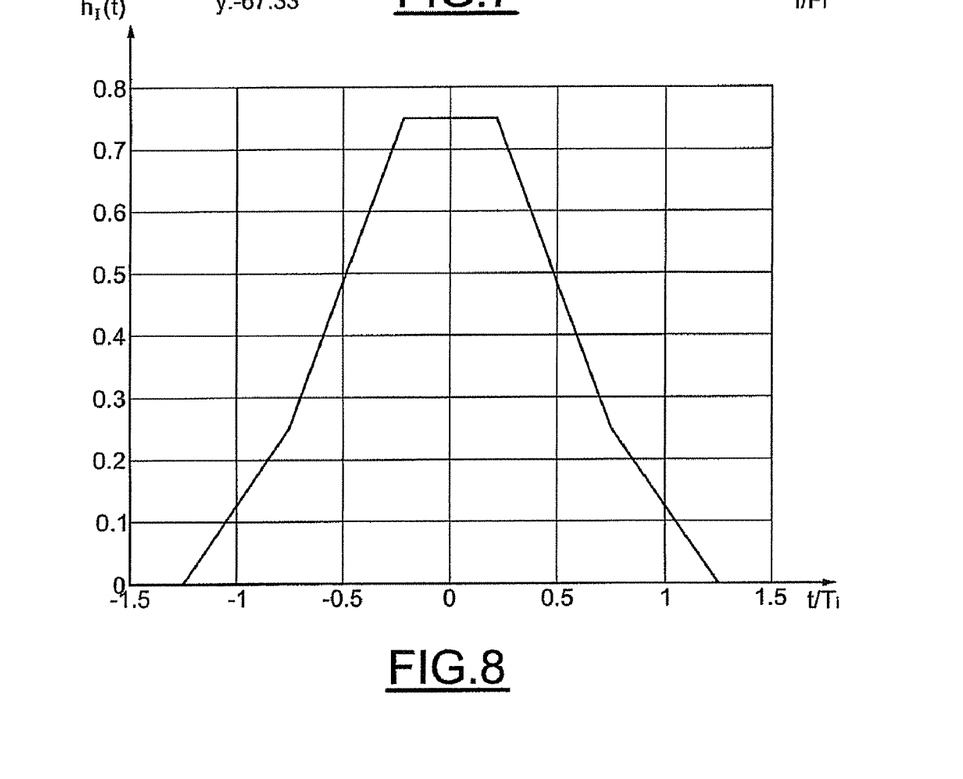

Such an amplitude/frequency response curve is illustrated in FIG. 7, while FIG. 8 represents the corresponding impulse response $h_i(t)$.

As the impulse response of the interpolation filter is based on $T_i$ and since $T_i$ is also the base of the temporal reference for the interpolation calculation (see FIGS. 4 and 5), it then becomes possible to determine each of the N coefficients of the filter (N=3 in the example) on the basis of a function of the temporal interval $\mu_k$.

This simplifies the calculation of the coefficients of the filter.

And further still, for a filter of the type of those using the product of a cardinal sine function and a cosinusoidal function, such as, for example, that illustrated in FIGS. 7 and 8, this function can include at least one linear zone.

Figure 9:
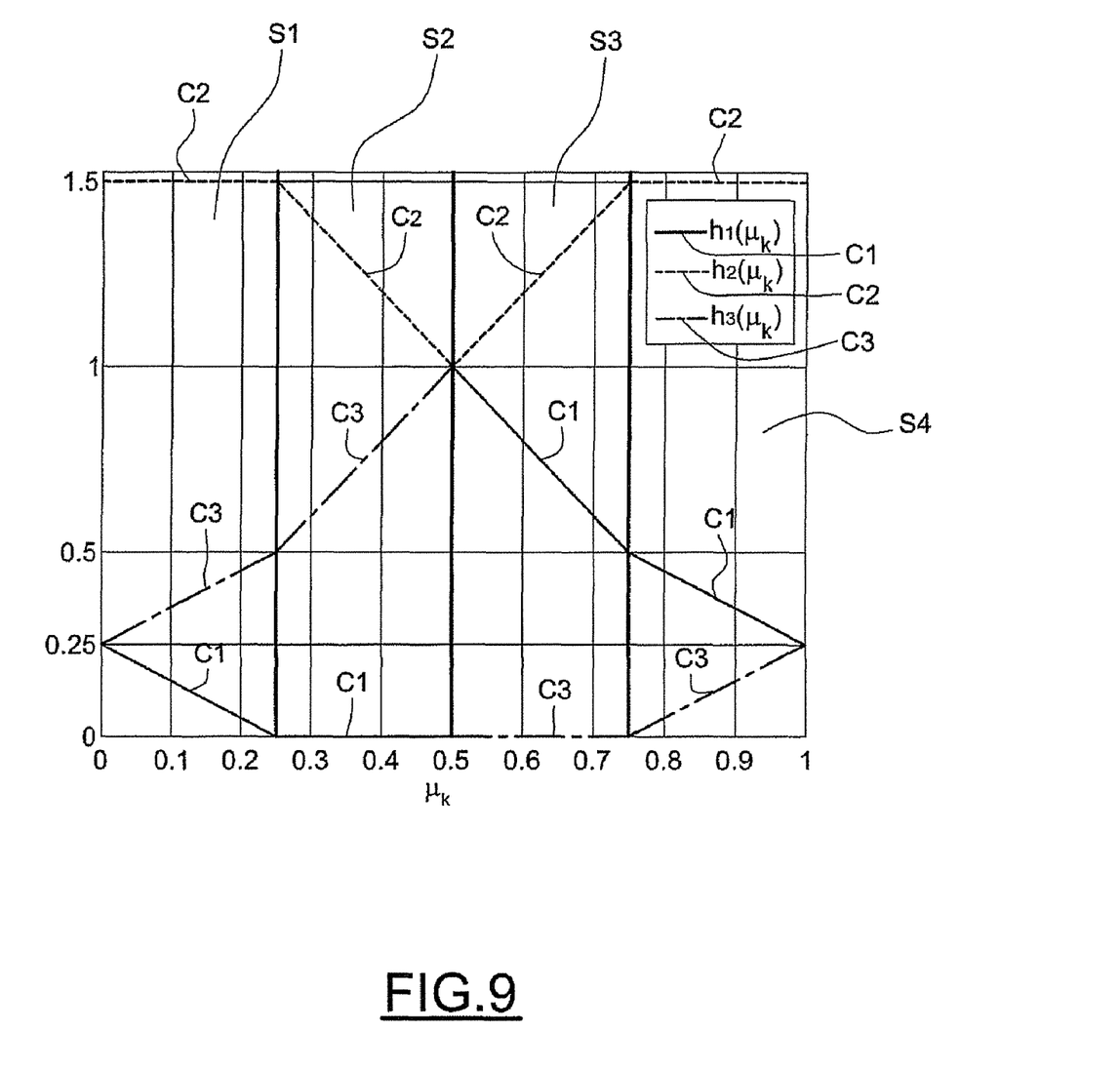

This is illustrated in FIG. 9. In this figure, curve C1 represents the evolution of the coefficient h1 as a function of $\mu_k$. Curve C2 represents the evolution of the coefficient h2 as a function of $\mu_k$, and curve C3 represents the evolution of the coefficient h3 as a function of $\mu_k$. It is seen that these curves are formed of linear zones, in this instance, straight line segments.

It should also be noted that for the sake of clarification, the values of the coefficients h1, h2 and h3 have intentionally been multiplied by 2 in FIG. 9.

In FIG. 9, it is seen that if the abscissa axis is subdivided into four sectors S1, S2, S3 and S4, as a function of the span of values of $\mu_k$, it is possible to define, as indicated in the table below, an auxiliary temporal interval $\mu'_k$ whose value is equal to that of the temporal interval $\mu_k$, but referred to the span [0; 0.25]. Stated otherwise, $\mu'_k$ always belongs to the span [0; 0.25].

TABLE 1

| Span of $\mu_k$ | $\mu_k \in [0; 0.25]$ | $\mu_k \in [0.25; 0.5]$ | $\mu_k \in [0.5; 0.75]$ | $\mu_k \in [0.75; 1]$ |
|---|---|---|---|---|
|  | $\mu'_k = \mu_k$ and $R_k = 0$ | $\mu'_k = \mu_k - 0.25$ and $R_k = 1$ | $\mu'_k = \mu_k - 0.5$ and $R_k = 2$ | $\mu'_k = \mu_k - 0.75$ and $R_k = 3$ |
| $H_1$ | $h_1(\mu'_k) = 0.25 - \mu'_k$ | $h_1(\mu'_k) = 0$ | $h_1(\mu'_k) = 1 - 2\mu'_k$ | $h_1(\mu'_k) = 0.5 - \mu'_k$ |
| $h_2$ | $h_2(\mu'_k) = 1.5$ | $h_2(\mu'_k) = 1.5 - 2\mu'_k$ | $h_2(\mu'_k) = 0.5 + 2\mu'_k$ | $h_2(\mu'_k) = 1.5$ |
| $h_3$ | $h_3(\mu'_k) = 0.25 + \mu'_k$ | $h_3(\mu'_k) = 0.5 + 2\mu'_k$ | $h_3(\mu'_k) = 0$ | $h_3(\mu'_k) = \mu'_k$ |

In the above table, the logic value Rk denotes, as a function of its value, the four sectors corresponding to the spans of values of μk. It is therefore seen in this array that linear expressions can be obtained between the coefficients h1, h2, h3 and μk. It is therefore possible to calculate on line the coefficients of the interpolation filter on the basis of μk without it being necessary to calculate them beforehand for any value of μk and to store them in a memory. This consequently results in a considerable space saving.

Moreover, with the change of parameters ($\mu_k$ into $\mu'_k$), a single multiplication by $\mu'_k$ may be necessary to calculate the contribution of a current input sample $x_k$. Actually, by way of example, in the sector corresponding to $R_k = 0$, the contribution $h1 \cdot x_k$ is equal to $(0.25 - \mu'_k)x_k$, which may also be written $0.25 \cdot x_k - \mu'_k x_k$. It is therefore seen that a single multiplication by $\mu'_k$ may be necessary. Indeed, the multiplication of $x_k$ by 0.25 is in fact a division of $x_k$ by 4, and this may very readily be achieved by a shift of bits.

This therefore results in a significant reduction in the complexity of implementation and embodiment of the corresponding device. This embodiment therefore makes it possible here to avoid doing three multiplications and to provide fast access to a memory. Furthermore, the only multiplication performed is on a low number of bits.

An exemplary embodiment of a sampling frequency conversion device DCF will now be described while referring more particularly to FIGS. 10 to 13.

Figure 10:
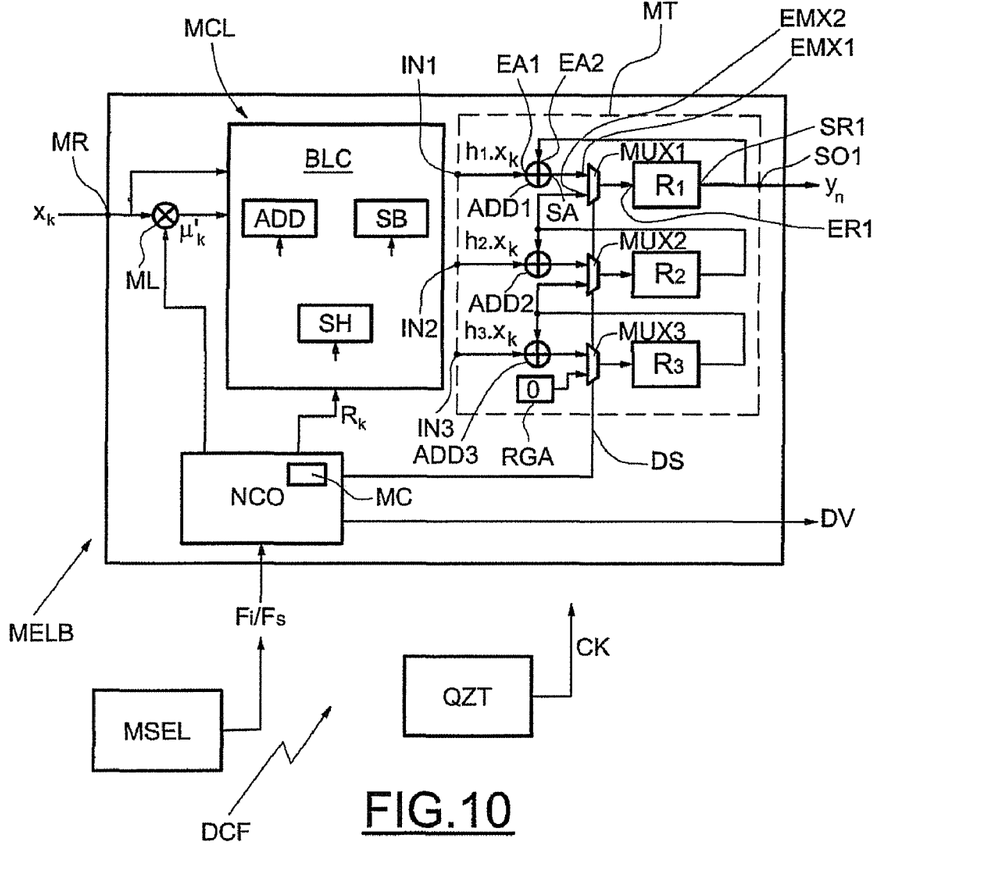
FIG. 10 illustrates in greater detail an exemplary embodiment of a sampling frequency conversion device according to the invention.

As illustrated in FIG. 10, the device DCF comprises a reception input MR able to receive the samples $x_k$ of the digital signal, a formulator MELB able to formulate the output samples $y_n$, and an output SO1 to deliver these output samples $y_n$.

The device DCF furthermore comprises a selector MSEL able to select the value of the ratio $F_s/F_i$ from a suite of predetermined values corresponding to sampling frequency values compatible with several different standards, for example, the WiMAX or WiFi standards. It should be noted here that the selector MSEL, in fact, selects the inverse of this ratio.

The formulator MELB includes a calculator MCL able to calculate the N contributions of each current input sample $x_k$, and a processor able to perform the updating of the values of the output samples.

In the exemplary embodiment described in FIG. 10, which corresponds to a particular embodiment implementing the on-line calculation of the coefficients of the interpolation filter on the basis of the parameter $\mu'_k$ in accordance with the above table, the calculator MCL includes a digitally controlled oscillator NCO that determines the temporal position of a current input sample with respect to the N temporal instants of interpolation respectively associated with the N output samples to be updated. The calculator also determines the values of the N coefficients of the filter on the basis of this temporal position. In the example described here, the temporal position is determined by way of the parameter $\mu'_k$. Also, the first detector comprises a digitally controlled oscillator NCO capable, on the basis of the periods $T_s$ and $T_i$, and of a clock signal CK of period $T_s$, delivered by a quartz QZT for example, of determining the parameter $\mu'_k$ for a current input sample $x_k$.

The calculator MCL also included a multiplier ML receiving the current sample $x_k$ and the parameter $\mu'_k$. The output of the multiplier as well as the sample $x_k$ are connected to two inputs of a block BLC comprising adders ADD, subtractors SB, and a shifter for shifting bits SH, all of which are individually selectable as a function of the value of the temporal interval $\mu_k$, in other words, as a function of the logic parameter $R_k$ delivered by the oscillator NCO. In fact, in this example, the calculation of the values of the coefficients of the filter and the calculation of the contributions are done globally within the block BLC.

The processor MT includes three inputs (N=3) IN1, IN2, IN3 to receive, respectively, the three contributions of a current input sample. The processor can moreover be three adders ADD1, ADD2, ADD3, each possessing a first input EA1 coupled to the corresponding input of the processor (IN1, IN2 or IN3) and a second input EA2. The processor also includes three multiplexers MUX1, MUX2, MUX3 to be controlled by controller MC functionally incorporated within the oscillator NCO, and each possessing a first input EMX1 connected to the output SA of the corresponding adder, and a second input EMX2.

The processor also includes a chain of three registers R1, R2, R3 each possessing an input ER1 coupled to the output of the corresponding multiplexer and an output SR1 coupled to the second input EA2 of the corresponding adder.

Moreover, the output of the last register of the chain, in this instance the register R1, is coupled to the output SO1, while the output of each of the other registers R2, R3 is coupled to the second input of the multiplexer associated with the following register in the chain of registers. More precisely, the output of the register R3 is coupled to the second input of the multiplexer MUX2, while the output of the register R2 is coupled to the second input of the register MUX1. The processor also includes an auxiliary register RGA containing a zero value data item and whose output is coupled to the second input of the multiplexer MUX 3 associated with the first register R3 of the chain.

Figure 11:
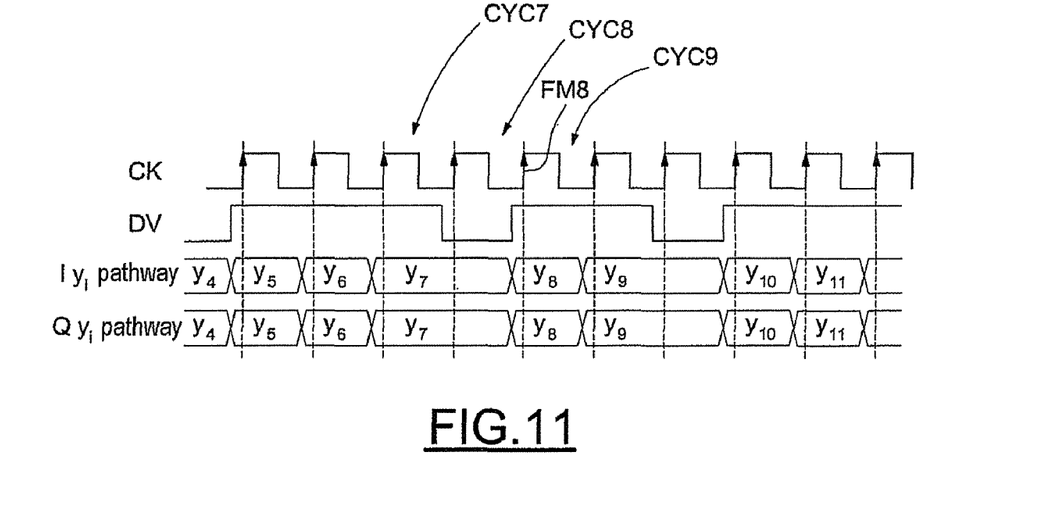
FIGS. 11 to 13 illustrate an exemplary manner of operation of the device of FIG. 10.
Figure 12:
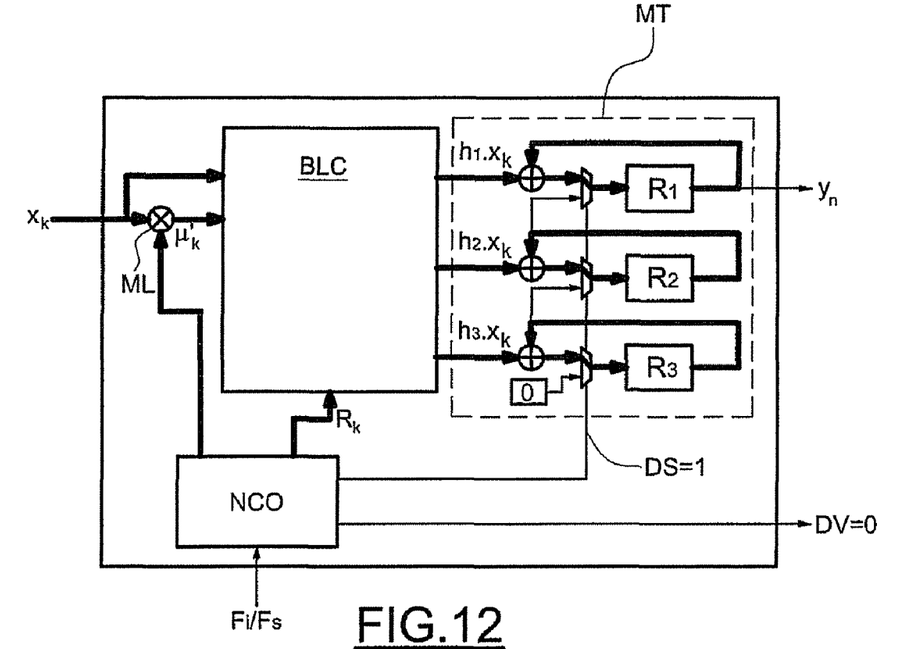
Figure 13:
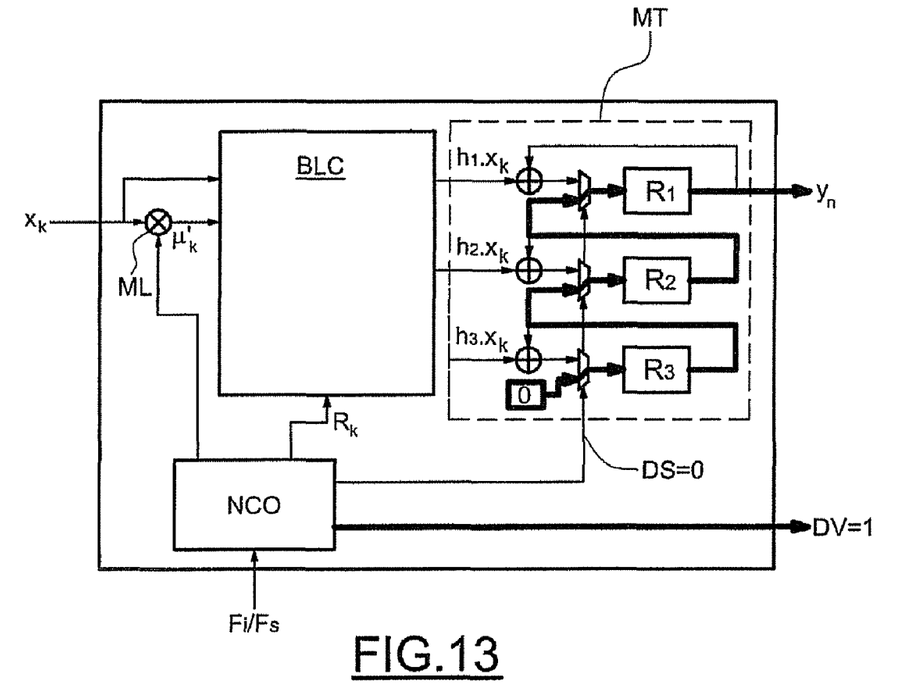

Reference is now made more particularly to FIGS. 11-13 to illustrate an exemplary manner of operation of the device of FIG. 10. The device DCF is regulated in time with the clock signal CK, an input sample $x_k$ arriving, for example, at each rising edge of the clock signal CK. During a period of the clock signal CK, the three contributions of the current input sample $x_k$ are calculated and transmitted to the processor. The control signal DS which controls the multiplexers of the processor takes the value 1, thereby linking the first input of the multiplexers to their output, and therefore looping back the output of each of the registers to the second input of the corresponding adder. This makes it possible to accumulate in each of the registers the corresponding contribution and to update the corresponding value of the output sample (FIG. 12).

Once this update has been performed, the oscillator NCO determines, by applying the condition CD1 mentioned above, whether the sample $y_n$ should or should not be delivered as output. If such is not the case, a logic signal DV takes the value "0", indicating that the output of the register R1 is not a valid data item. In the converse case, the signal DV rises to "1", indicating that the output of the register R1 is valid.

In the example which is described here, output samples of rank n to n+2 are updated and, in this regard, the three registers R1, R2 and R3, in each of which the various contributions arising from the various input samples are accumulated for the output sample considered, are assigned respectively to these three output samples.

When the sample $y_n$ should be delivered, the value contained in the register R1 is delivered and the registers R1 and R2 are assigned to the samples $y_{n+1}$ and $y_{n+2}$, while the output sample $y_{n+3}$ is assigned to the register R3. Also, the register R3 is initialized to a chosen initialization value, in this instance the value "0", for example. This shift of registers is performed by controlling the signal DS, which takes the value "0", for example, and which makes it possible to link the second inputs of the multiplexers to their corresponding outputs (FIG. 13). Of course, as long as the signal DV is at "0", the configuration of FIG. 12 is maintained, accumulating the various contributions arising from the various input samples.

Not all the output samples receive an identical number of contributions for their updating. For example, as illustrated in FIG. 11, the edges of the signal DV have been slightly shifted with respect to the rising edge of the clock signal CK. In the example described, the sample $y_4$ (on the I pathway and on the Q pathway) illustratively is ready to be delivered on the first rising edge of the clock signal CK, which results in the rise of the signal DV to "1".

During the following cycle of the clock signal CK, the sample $y_5$ is updated and is also ready to be delivered. Consequently, the signal DV stays at "1" and the sample $y_5$ is delivered on the following rising edge of the clock signal CK.

In the course of the following cycle, the sample $y_6$ is further updated and is also ready to be delivered on the following rising edge of the clock signal CK. The signal DV is still at "1".

In the course of the following cycle CYC7, the following output sample $y_7$ is still being formulated. At the end of this cycle CYC7, the sample $y_7$ is not ready to be delivered since its formulation allows receiving the contribution of a following input sample. The signal DV therefore falls back to "0" and stays at this value during the following cycle CYC8, in the course of which the formulation of the output sample $y_7$ continues by updating its value with two other contributions originating respectively from the following two input samples. It is only at the end of the cycle CYC8 that the sample $y_7$ is ready to be delivered, which occurs on the rising edge FM8 of the clock signal CK. The signal DV then reverts to the value "1".

In the course of the following cycle CYC9, the sample $y_8$ is delivered. The sample $y_9$ is updated in the course of the cycle CYC9, but this sample will require two more clock cycles of the signal CK to be updated before being delivered. Then the sample $y_{10}$ and the sample $y_{11}$ is generally respectively one and two more clock cycles of the signal CK to be updated before being delivered.

It is therefore seen that the output samples $y_n$ are delivered in time with the rising edges of the clock signal CK, but only on some of these rising edges as a function of the number of contributions for each of the output samples $y_n$.

The number of contributions is different for the output samples. Each number of contributions depends on N, on the conversion ratio, and also on $\mu_k$ (see condition CD1 above). In general the number of contributions is greater than or equal to N, and in practice, much greater than N.

The frequency of delivery of the output samples is therefore different from the sampling frequency $F_i$. From the signal processing viewpoint, the output samples $y_n$ are representative of a sampling of the digital signal at a frequency $F_i$.

Simulations show that the power consumed of a frequency conversion device in accordance with aspects varies substantially linearly with the first sampling frequency $F_s$. On the other hand, for a given frequency $F_s$, this power consumed is substantially constant whatever the value of the conversion ratio $F_s/F_i$, whereas in the prior art approaches providing for storage of filter coefficients for each conversion ratio envisaged, the power consumed increases as the value of the conversion ratio increases.

Figure 14:
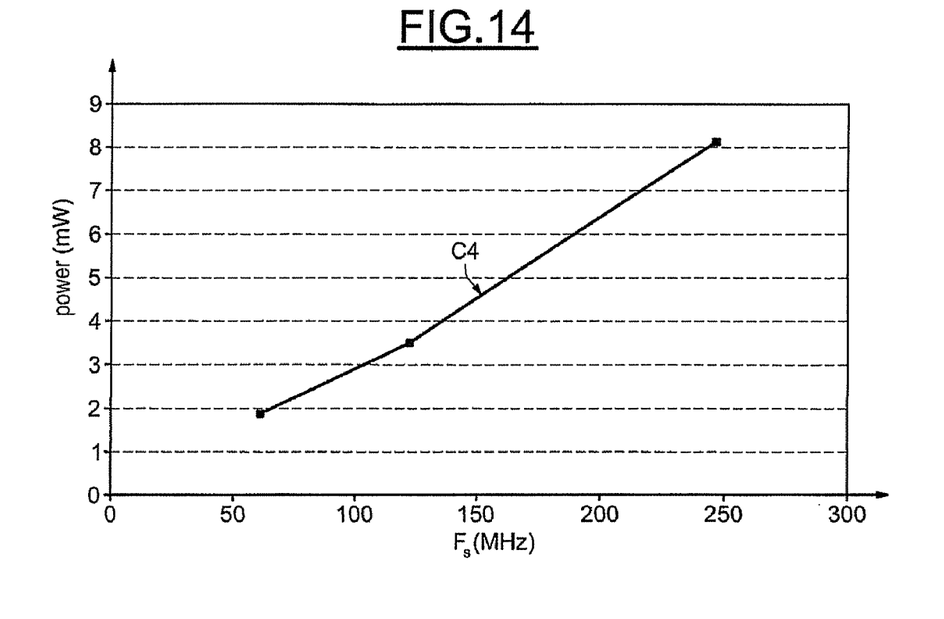
FIGS. 14 and 15 illustrate curves of evolution of power consumed.
Figure 15:
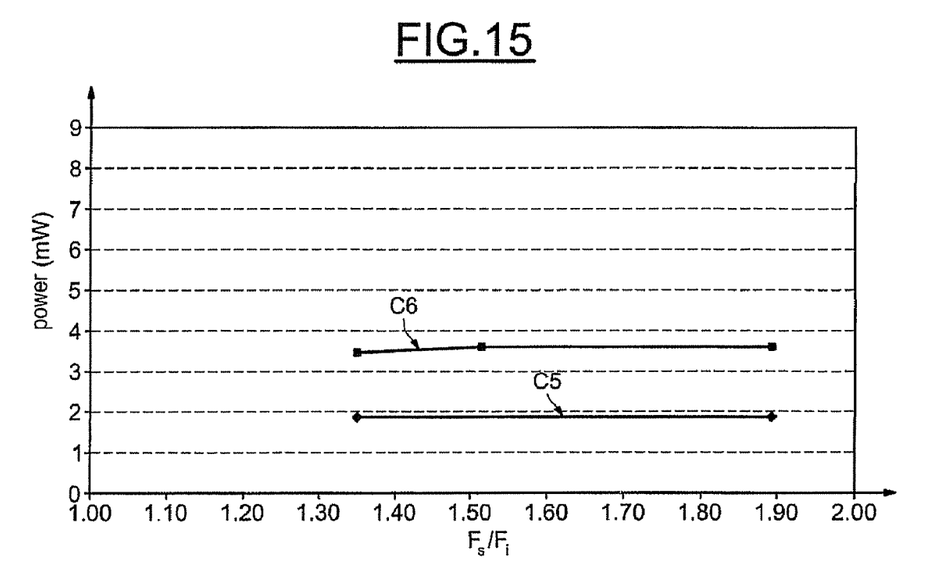

These simulation results are illustrated more particularly in FIGS. 14 and 15 which relate to a device of the type of that of FIG. 10, embodied with 65 nm technology. In FIG. 14, curve C4 illustrates the substantially linear trend of the power as a function of $F_s$. In FIG. 15, curve C5 illustrates the substantially constant character of the power as a function of the conversion ratio, for a frequency $F_s$ equal to 60 MHz, while curve C6 is plotted for a frequency $F_s$ equal to 120 MHz. A substantially constant power of the order of 8 mW would be obtained for a frequency $F_s$ equal to 240 MHz.

That which is claimed is:

1. A method for converting a sampling frequency of a digital signal sampled at a first sampling frequency, the method comprising:
receiving digital signal input samples; and
generating output samples corresponding to a second sampling frequency based on the digital signal input samples and an interpolation filter, the first sampling frequency being larger than the second sampling frequency;
wherein generating the output samples comprises, for each of the digital signal input samples, updating current values of N successive output samples with N contributions, the N contributions being respectively calculated based on a value of a current input sample of the digital signal input samples weighted by values of N filter coefficients of the interpolation filter associated with the current input sample, with N being an integer greater than 1, fixed and identical for all the digital signal input samples regardless of a value of a conversion ratio between the first and second sampling frequencies.

2. The method according to claim 1, wherein one of the output samples comprises a value updated with the contribution originating from the current input sample when its value has been updated with a contribution from a current input sample and the output sample not receiving any contribution originating from a following input sample.

3. The method according to claim 2, wherein updating the current values of the N successive output samples, having ranks n to n+N−1 with n being an integer, comprises respectively assigning the N successive samples to N storage having ranks $r_1$ to $r_n$, each N storage accumulating, for a considered output sample, the contribution arising from the digital input samples, and wherein the output samples of a rank n comprise a value in the storage of rank $r_1$, assigning to registers of ranks $r_1$ to $r_{n-1}$ to output samples of ranks n+1 to n+N−1, and initializing the register of rank $r_n$ to a chosen initialization value.

4. The method according to claim 1, wherein the digital signal input samples are received and the output samples are formed in time with edges of a clock signal having a frequency equal to the first sampling frequency, and the output samples are delivered on a portion of the edges of the clock signal.

5. The method according to claim 1, wherein the value of the conversion ratio is selected from non-integer values.

6. The method according to claim 1, wherein the value of the conversion ratio is selected from values corresponding to values of second sampling frequencies that are compatible with at least one of a WiMax and WiFi standard.

7. The method according to claim 1, wherein a width of an impulse response of the interpolation filter fixes a value N.

8. The method according to claim 1, wherein the interpolation filter has an impulse response width equal to the product of a multiplying coefficient, and a second time period corresponding to the second sampling frequency, and wherein a value of N is fixed at a value equal to a higher integer part of the multiplying coefficient.

9. The method according to claim 1, wherein the interpolation filter has an amplitude/frequency response curve having zeros at frequencies which are multiples of the second sampling frequency.

10. The method according to claim 9, wherein the amplitude/frequency response curve is a form of a product of a cardinal sine function squared times a cosine function.

11. The method according to claim 1, wherein the calculation of the N contributions of each current input sample comprises determining a temporal position of the current input sample with respect to N temporal instants of interpolation, spaced mutually apart by a second time period corresponding to the second sampling frequency and respectively associated with the N updated successive output samples, and the determination of the values of the N filter coefficients being based on the temporal position.

12. The method according to claim 11, wherein each of the digital signal input samples arrive at a first temporal instant of interpolation, and determining the temporal position of a current input sample with respect to the N temporal instants of interpolation comprises determining a temporal interval between the first temporal instant associated with the current input sample and one of the N temporal instants of interpolation, and wherein determining other temporal intervals between the first instants and N−1 other temporal instants of interpolation is based on the temporal interval, and the values of the N coefficients of the interpolation filter correspond respectively to values of an impulse response of the interpolation filter at the temporal interval.

13. The method according to claim 12, wherein determining each of the N filter coefficients of the interpolation filter is based on a function of the temporal interval.

14. The method according to claim 13, wherein the function comprises at least one linear zone.

15. The method according to claim 14, wherein a value of the temporal interval varies between 0 and 1, wherein an auxiliary temporal interval is based on a temporal interval having a value equal to a span [0; 0.25], and wherein calculating a contribution of a current input sample comprises a single multiplying of the value of the current input sample with a value of the auxiliary temporal interval.

16. A method for processing an analog signal, comprising:
performing an analog/digital conversion of the analog signal;
receiving digital signal input samples from the analog/digital conversion; and
generating output samples corresponding to a second sampling frequency based on the digital signal input samples and an interpolation filter, the first sampling frequency being larger than the second sampling frequency;
wherein generating the output samples comprises, for each of the digital signal input samples, updating current values of N successive output samples with N contributions, the N contributions being respectively calculated based on a value of a current input sample of the digital signal input samples weighted by values of N filter coefficients of the interpolation filter associated with the current input sample, with N being an integer greater than 1, fixed and identical for all the digital signal input samples regardless of a value of a conversion ratio between the first and second sampling frequencies.

17. The method according to claim 16, wherein the analog/digital conversion comprises a delta-sigma type conversion.

18. The method according to claim 16, wherein the analog signal is selected to be compatible with at least one of a WiMAX and WiFi standard.

19. A method for converting a sampling frequency of a digital signal sampled at a first sampling frequency, the method comprising:
receiving digital signal input samples; and
generating output samples corresponding to a second sampling frequency based on the digital signal input samples with the first sampling frequency being larger than the second sampling frequency;
wherein generating the output samples comprises updating current values of N successive output samples with N contributions, with N being an integer greater than 1, the N contributions being respectively calculated based on a value of a current input sample of the digital signal input samples weighted by values of N filter coefficients associated with the current input sample.

20. The method according to claim 19, wherein one of the output samples comprises a value updated with the contribution originating from the current input sample when its value has been updated with a contribution from a current input sample and the output sample not receiving any contribution originating from a following input sample.

21. The method according to claim 20, wherein updating the current values of the N successive output samples having ranks n to n+N−1, with n being an integer, comprises respectively assigning the N successive samples to N storage having ranks $r_1$ to $r_n$, each N storage accumulating, for a considered output sample, the contribution arising from the digital input samples and wherein the output samples of rank n comprise a value in the storage of rank $r_1$, assigning to registers of ranks $r_1$ to $r_{n-1}$ to output samples of ranks n+1 to n+N−1, and initializing the register of rank $r_n$ to a chosen initialization value.

22. The method according to claim 19, wherein the digital signal input samples are received and the output samples are formed in time with edges of a clock signal having a frequency equal to the first sampling frequency, and the output samples are delivered on a portion of the edges of the clock signal.

23. A device for converting the sampling frequency of a digital signal sampled at a first sampling frequency, the device comprising:
a receiver for receiving digital signal input samples;
a generator for generating the output samples corresponding to a second sampling frequency based on the digital signal input samples and an interpolation filter, the first sampling frequency being larger than the second sampling frequency; and
the generator comprising
a calculator for calculating N contributions for a current digital signal input sample of the digital signal input samples respectively based on a value of the current digital signal input sample weighted by values of N filter coefficients associated with the current input sample, with N being an integer greater than 1, fixed and identical for all the digital signal input samples regardless of a value of a conversion ratio between the two frequencies, and
a processor for updating current values of N successive output samples with the N contributions for each digital signal input sample.

24. The device according to claim 23, wherein the generator further comprises a controller for authorizing the delivery of an output sample having a value updated with a contribution originating from the current input sample when its value has been updated with a contribution from a current input sample and an output sample not receiving any contribution originating from a following input sample.

25. The device according to claim 24, wherein the processor comprises:
N inputs for receiving respectively N contributions of a current input sample;
N adders each having a first input coupled to the corresponding input of the processor and a second input;
N multiplexers being controlled by the controller and each having a first input coupled to an output of a corresponding adder and a second input;
a chain of N registers each possessing an input coupled to the output of a corresponding multiplexer and an output coupled to the second input of the corresponding adder; the output of a last register of the chain of N registers being coupled to the output of each other register, each other register being coupled to the second input of the multiplexer associated with a following register in the chain of N registers; and
an auxiliary register including a zero value data item and coupled to the second input of a multiplexer associated with a first register of the chain of N registers.

26. The device according to claim 23, wherein the receiver is for receiving the digital signal input samples in time with edges of a clock signal having a frequency equal to the first sampling frequency; wherein the generator is for generating the digital signal output samples in time with the edges of the clock signal; and wherein the digital signal output samples are delivered on a portion of the edges of the clock signal.

27. The device according to claim 23, further comprising a selector for selecting the value of the conversion ratio from non-integer values.

28. The device according to claim 23, further comprising a selector for selecting the value of the conversion ratio from values of second sampling frequencies that are compatible with at least one of the WiMax and WiFi standard.

29. The device according to claim 23, wherein a width of an impulse response of the interpolation filter fixes a value of N.

30. The device according to claim 23, wherein the interpolation filter has an impulse response width equal to the product of a multiplying coefficient, and a second time period corresponding to the second sampling frequency, and wherein a value of N is fixed at a value equal to a higher integer part of the multiplying coefficient.

31. The device according to claim 23, wherein the interpolation filter has an amplitude/frequency response curve having zeros at frequencies which are multiples of the second sampling frequency.

32. The device according to claim 31, wherein the amplitude/frequency response curve is a form of a product of a cardinal sine function squared times a cosine function.

33. The device according to claim 23, wherein the calculator comprises a first detector for determining a temporal position of the current digital input sample with respect to N temporal instants of interpolation, respectively associated with the N successive output samples to be updated, and a second detector for determining the values of the N filter coefficients based on the temporal position.

34. The device according to claim 33, wherein the first detector determines a temporal interval between a first instant associated with the current digital signal input sample and one of the N temporal instants of interpolation, for determining other temporal intervals between the first instant and N−1 other temporal instants of interpolation is based on the temporal interval; and wherein the values of the N coefficients of the interpolation filter correspond respectively to values of an impulse response of the interpolation filter at the temporal intervals.

35. The device according to claim 34, wherein the second detector determines each of the N filter coefficients of the interpolation filter based on a function of the temporal interval.

36. The device according to claim 35, wherein the function of the temporal interval comprises at least one linear zone.

37. The device according to claim 36, wherein a value of the temporal interval varies between 0 and 1 and the first detector is for determining an auxiliary temporal interval based on a temporal interval having a value equal to [0; 0.25], and wherein the calculator comprises a single multiplier having an input coupled to the receiver and a second input coupled to the first detector for receiving the auxiliary temporal interval.

38. The device according to claim 37, wherein the calculator further comprises a block comprising at least one additional adder, at least one subtractor and at least one shifter for shifting bits individually selectable as a function of the value of the temporal interval.

39. A device for processing an analog signal comprising:
an input for receiving the analog signal;
an analog/digital converter coupled to said input and having an output for outputting a digital signal; and
a sampling frequency conversion device having a sampling frequency conversion device input that is coupled to the analog/digital converter output and comprising
a receiver for receiving input samples of the digital signal,
an interpolation filter, and
a generator for generating the output samples corresponding to a second sampling frequency based upon the input samples and of the interpolation filter, the first sampling frequency being larger than the second sampling frequency,
the generator comprising
a calculator for calculating N contributions for each current input sample respectively based on a value of the current input sample weighted by values of N filter coefficients of the interpolation filter associated with this input sample, with N being an integer greater than 1, fixed and identical for all the input samples whatever the value of a conversion ratio between the two frequencies, and
a processor for updating the current values of N successive output samples with the N contributions for each input sample.

40. The device according to claim 39, wherein the analog/digital converter comprises a delta-sigma type analog/digital converter.

41. A wireless communications system receiver comprising:
an antenna for receiving an incident signal; and
an analog/digital converter coupled to said antenna; and
a sampling frequency conversion device coupled to the analog/digital converter and comprising
a receiver for receiving input samples of the incident signal,
an interpolation filter, and
a generator for generating output samples corresponding to a second sampling frequency based upon the input samples and the interpolation filter, the first sampling frequency being larger than the second sampling frequency, and
the generator comprising
a calculator for calculating N contributions for each current input sample respectively based on a value of the current input sample weighted by values of N filter coefficients of the interpolation filter associated with this input sample, with N being an integer greater than 1, fixed and identical for all the input samples whatever the value of a conversion ratio between the two frequencies, and
a processor for updating current values of N successive output samples with the N contributions for each input sample.

42. The wireless communications system receiver according to claim 41, wherein said antenna is for receiving multi-standard incident signals.

43. The wireless communications system receiver according to claim 42, wherein one of the multi-standard incident signals is selected to be compatible with at least one of a WiMAX and WiFi standard.

* * * * *